(12) United States Patent
Engler et al.

(10) Patent No.: US 8,012,252 B2
(45) Date of Patent: Sep. 6, 2011

(54) DURABLE HARD COATING CONTAINING SILICON NITRIDE

(75) Inventors: Martin Engler, Kempten (DE); Christoph Lesniak, Buchenberg (DE); Krishna Uibel, Kempten (DE)

(73) Assignee: ESK CERAMICS GmbH & Co., KG, Kempten (DE)

( * ) Notice: Subject to any disclaimer, the term of this patent is extended or adjusted under 35 U.S.C. 154(b) by 0 days.

(21) Appl. No.: 11/582,449

(22) Filed: Oct. 18, 2006

(65) Prior Publication Data

US 2007/0089642 A1    Apr. 26, 2007

(30) Foreign Application Priority Data

Oct. 21, 2005   (DE) .................. 10 2005 050 593

(51) Int. Cl.
*B28B 7/36* (2006.01)
*B32B 9/00* (2006.01)

(52) U.S. Cl. ............. 106/38.2; 106/38.22; 106/287.11; 428/701

(58) Field of Classification Search .............. 428/446; 106/287.11
See application file for complete search history.

(56) References Cited

U.S. PATENT DOCUMENTS

| | | | | |
|---|---|---|---|---|
| 4,028,096 A | * | 6/1977 | Banker et al. ............... 75/398 |
| 4,548,381 A | * | 10/1985 | Mabie et al. ............ 249/114.1 |
| 4,921,731 A | | 5/1990 | Clark et al. |
| 5,431,869 A | * | 7/1995 | Kumar et al. ................ 264/85 |
| 6,153,496 A | * | 11/2000 | Hassler et al. ............. 438/488 |
| 6,165,425 A | * | 12/2000 | Lange et al. ................ 422/243 |
| 6,334,603 B1 | * | 1/2002 | Wakita et al. ............... 249/112 |
| 6,479,108 B2 | * | 11/2002 | Hariharan et al. .......... 427/453 |
| 6,491,971 B2 | * | 12/2002 | Costantini et al. .......... 427/133 |
| 2002/0051889 A1 | * | 5/2002 | Kanamori et al. ........... 428/447 |
| 2004/0102308 A1 | * | 5/2004 | Simpson et al. ............ 501/104 |
| 2004/0211496 A1 | | 10/2004 | Khattak et al. |
| 2004/0237713 A1 | * | 12/2004 | Breslin et al. ................. 75/235 |
| 2005/0059760 A1 | * | 3/2005 | Dellwo et al. ............... 524/409 |
| 2005/0224452 A1 | * | 10/2005 | Spiess et al. .................. 216/41 |
| 2006/0159909 A1 | * | 7/2006 | Aslan et al. ................. 428/323 |
| 2006/0194886 A1 | * | 8/2006 | Adam et al. ................... 516/99 |
| 2007/0054057 A1 | * | 3/2007 | Matje et al. ............... 427/421.1 |
| 2007/0240635 A1 | * | 10/2007 | Rancoule .................... 117/208 |
| 2009/0105062 A1 | | 4/2009 | Thaler et al. |
| 2009/0119882 A1 | | 5/2009 | Uibel |
| 2009/0121197 A1 | | 5/2009 | Thaler et al. |
| 2009/0236780 A1 | | 9/2009 | Engler et al. |

FOREIGN PATENT DOCUMENTS

| | | |
|---|---|---|
| DE | 103 26 815 | 12/2004 |
| WO | 2004/053207 | 6/2004 |
| WO | WO 2004110671 A2 * | 12/2004 |

OTHER PUBLICATIONS

DeGussa technical bulletin (Aerosil: Versatile and Effective), Mar. 2003, 5 pages.*

* cited by examiner

*Primary Examiner* — Robert Loewe
(74) *Attorney, Agent, or Firm* — The Nath Law Group

(57) ABSTRACT

The invention relates to a slip for producing a durable hard coating on a substrate, comprising a) silicon nitride particles and b) a binder comprising nanosize solid particles and/or precursors of nanosize solid particles from production via a sol-gel process. The invention further relates to shaped bodies composed of a substrate with a durable hard coating which has been produced from a slip according to the invention. The shaped bodies of the invention are suitable for use in the field of corrosive nonferrous metal melts.

13 Claims, No Drawings

DURABLE HARD COATING CONTAINING SILICON NITRIDE

FIELD OF THE INVENTION

The present invention relates to a slip for producing a durable hard coating containing silicon nitride on a substrate, a shaped body comprising a substrate and a durable hard coating applied thereto which is abrasion- and scratch-resistant so that the shaped body is transportable, a process for producing such a shaped body and the use of such shaped bodies, in particular as melting crucibles for use in the field of corrosive nonferrous metal melts, in particular in the field of solar silicon processing, and also the use of such a shaped body as riser tube in aluminium metallurgy, in particular low-pressure aluminium casting.

BACKGROUND OF THE INVENTION

The melting and recrystallization of silicon bars comprising silicon particles, silicon granules or silicon pieces are carried out using crucibles made of graphite or silicon nitride, but mainly $SiO_2$ (fused silica). Silicon bars having the desired micro-structures and purities crystallize from the melt during precisely defined cooling processes, and these silicon bars are subsequently cut into thin wafers and form the active constituent of photovoltaic units.

It is important here that the solar silicon quality is not adversely affected by the materials used in processing, e.g. melting crucibles, and the silicon melt can solidify without defects and can be removed undamaged from the crucible. In this context, it is important to prevent corrosive attack of liquid silicon metal on the crucible material, since the melt would otherwise become contaminated. Furthermore, adhesion, infiltration and diffusion lead to problems in the demoulding of the silicon bars, so that there is a risk of rupture or cracking of the polycrystalline silicon block.

The corrosive silicon melt results in attack on the $SiO_2$ crucible, since a chemical reaction between Si and $SiO_2$ takes place to form volatile SiO. In addition, undesirable impurities from the crucible material get into the silicon melt in this way.

In particular, adhering material on the solidifying or solidifying silicon block should be avoided at all costs, since silicon undergoes very large thermal expansions so that very small amounts of adhering material lead to mechanical stress and thus to fracture of the crystalline structure, which results in reject silicon material.

In aluminium metallurgy, in particular in low-pressure aluminium casting, riser tubes made of iron alloys or fused silica are used. Due to the highly corrosive aluminium melt at temperatures in the range from 650 to 800° C., these riser tubes have to be coated with refractory oxides or nitrides at regular intervals in order to avoid rapid dissolution of these materials in liquid aluminium. Use is here usually made of coatings of aluminium oxide or boron nitride which are applied from slips containing organic binders by dipping, brushing or spraying. However, as a result of the combined corrosive and mechanical attack by the hotmelt and the floating slag, the life of such coatings is limited to hours or a few days. Riser tubes made of silicon nitride ceramic, which are completely inert towards corrosive attack by aluminium melts, are also used as alternatives to the coated riser tubes made of iron alloy or quartz. However, the costs of these silicon nitride tubes are many times that of standard riser tubes with a coating.

PRIOR ART

Melting crucibles made of quartz, graphite or ceramic and provided with silicon nitride layers for the purpose of avoiding sticking between melting crucible and nonferrous metals after contact of the melting crucible with solidifying nonferrous metal melts, e.g. silicon melts, are known from EP 963 464 B1. Here, the layers comprise a high-purity silicon nitride powder. The silicon nitride powders have a low oxygen content and a particular aspect ratio. These powder coatings are applied directly by the user before use of the melting crucibles and are produced by dispersing high-purity silicon nitride powder in a solvent and then applying it to the crucibles by, for example, spraying of the suspension. The solvent and any organic binder constituents used have to be removed by thermal after-treatment.

The high-purity silicon nitride itself has been found to be very chemically resistant towards silicon melts. However, the weight of the melt alone leads to forced wetting or infiltration of the porous silicon nitride powder layer. This therefore has to have such a thickness that it cannot be totally infiltrated and can therefore still serve as release or demoulding layer. However, such thick layers are in turn correspondingly soft and not particularly abrasion-resistant, so that particular care has to be taken when charging the crucibles, not to mention avoidance of long transport routes or the dispatch of ready-to-use coated crucibles.

The conventional crucible coatings for use in the field of solar silicon thus have the disadvantage that the coatings have a low mechanical stability, since these consist only of silicon nitride powder so that coating always has to be carried out immediately before charging of the crucibles with the silicon powder, granules or pieces. Prior coating of the crucibles other than directly at the point of use is thus not possible. Furthermore, owing to the soft powder coatings, extreme care has to be taken when charging the crucibles with large pieces of material in order to avoid damage to the layer. In addition, undesirable caked residues occur on demoulding because of infiltration of the porous silicon nitride powder layer by the molten silicon.

DE 103 26 769 B3 describes durable boron nitride mould release layers for the pressure casting of nonferrous metals and also slips for producing them, with refractory nanosize binders being used as binder phase for boron nitride. In particular, suspensions of $SiO_2$-based sol-gel binder and boron nitride powder are applied to metal surfaces or inorganic non-metal surfaces and the coatings obtained in this way are dried and thermally densified. At temperatures above 500° C., the binder system is converted into a vitreous matrix which gives the dense ceramic layer formed mechanical stability. However, these layers containing boron nitride cannot be used in the field of solar silicon, since boron nitride is undesirable as impurity in solar silicon.

DE 103 26 815 A1 describes a substrate having an antiadhesive coating which is obtainable by applying a coating composition to a substrate and hardening, with the coating composition comprising a) solid particles of a release agent with the exception of boron nitride and b) a binder comprising surface-modified nanosize solid particles. The release agent particles are selected from among graphite, graphite compounds, metal sulphides, metal selenides and metal tellurides. These coatings, too, are not suitable for use in conjunction with solar silicon since the release agents mentioned there, e.g. graphite or metal sulphides, selenides and tellurides, are undesirable as impurities in solar silicon.

OBJECT OF THE INVENTION

It is therefore an object of the invention to provide a slip for producing a durable coating on a substrate, which coating is particularly suitable for applications in the field of solar silicon processing without having the disadvantages known in the prior art. Furthermore, a durable and inexpensive coating for applications in aluminium metallurgy which should, in particular, enable the operating life of riser tubes to be increased should be provided.

SUMMARY OF THE INVENTION

The invention accordingly provides a slip for producing a durable hard coating on a substrate, comprising a) silicon nitride particles and b) a binder comprising nanosize solid particles and/or precursors of nanosize solid particles from production via a sol-gel process.

The invention further provides a shaped body comprising a substrate having a durable hard coating, wherein the hard coating has been produced from an inventive slip as defined above.

The invention further provides for the use of a shaped body according to the invention in the field of corrosive nonferrous metal melts, in particular the use of a shaped body in the form of a melting crucible for producing silicon melts, and the use of a shaped body in the form of a riser tube in aluminium metallurgy, in particular low-pressure aluminium casting.

The surprising effect displayed by the hard silicon nitride coatings of the invention is that the rigidly bound silicon nitride particles present here do not hinder demoulding of solidified nonferrous metal melts and at the same time do not have the disadvantages of the porous and loose silicon nitride powder layer structure during transport and charging of the shaped bodies provided with such hard coatings.

It would have been surprising to a person skilled in the art that the $SiO_2$-based binder systems known from DE 103 26 769 B3 and DE 103 26 815 A1 are suitable for producing durable hard silicon nitride coatings for the applications envisaged according to the invention, since he would have expected that the additional inorganic binders or nanosize solid particles would make demoulding of the solidified nonferrous metal melts more difficult and that impurities would be introduced into the solidified nonferrous metal melts, in particular solar silicon blocks, which is to be avoided at all costs. In addition, a person skilled in the art would have expected that the use of an $SiO_2$-based binder system would likewise lead to reactions between the molten silicon and the $SiO_2$ of the binder system, as is the case in the system Si melt and $SiO_2$ crucible. The Si melt corrosively attacks the $SiO_2$ material to form gaseous SiO which is given off so that further $SiO_2$ is exposed to the Si melt. The coating would have to be dissolved continuously by this reaction. This reaction is known, for example, from Cryst. Res. Technol. 38, No. 7-8, 669-675 (2003).

The hard silicon nitride layers of the invention have, in particular, the following advantages:

The hard layers are absolutely transport-stable, so that ready-to-use coated shaped bodies such as melting crucibles can be delivered to the end user.

The coatings are abrasion-resistant and therefore offer protection against damage during charging of the shaped bodies, in particular during charging of coated melting crucibles with raw silicon or during handling of such shaped bodies. Furthermore, conventional silicon nitride powder coatings suffer from undesirable corrosion phenomena and adhesion due to damage to the protective layer, which is not the case for the hard layers of the invention.

The hard layers of the invention are impermeable and stable at high temperatures and are not infiltrated by the molten nonferrous metal such as silicon, so that the solidified melts can be demoulded without adhesion. The additional step of mechanical removal of adhering material therefore becomes unnecessary and no rejects or fewer rejects occur. Furthermore, in the case of the conventional silicon nitride powder layers, adhering material occurs after demoulding since the porous silicon nitride layer is infiltrated by the molten nonferrous metal such as silicon. This adhering material has to be removed mechanically, which firstly represents an additional process step and secondly results in loss of material.

In the case of the layers according to the prior art (EP 963 464), there is the problem that, due to the porous silicon nitride powder layer, impurities from the $SiO_2$ crucible can diffuse into the solar silicon because there is the possibility of melt-substrate contact. As a result, impurities are introduced into the solar silicon, which leads to a considerable deterioration in quality and thus to rejecting materials.

The layers of the invention have the further advantage that, owing to their dense structure, the layers act as diffusion barriers for impurities because they prevent direct melt-substrate contact.

When the hard silicon nitride coating is employed for riser tubes in aluminium metallurgy, considerable cost advantages are achieved since the inexpensive base material for riser tubes (the substrate) can continue to be used and at the same time the operating life of the riser tubes can be considerably increased. Furthermore, there is likewise the possibility of repairing the coating in the event of damage to the hard coatings.

DETAILED DESCRIPTION OF THE INVENTION

The binder used according to the invention, which comprises nanosize solid particles and/or precursors of nanosize solid particles from production via a sol-gel process, is known in principle from DE 103 26 815 A1. It has been found that the silicon nitride particles can be bound durably and in a thermally stable fashion to substrate surfaces by means of this binder. In a preferred embodiment, a nanoparticle-containing nano-composite, in particular in the form of a sol, is used as binder. A nanocomposite or a nanocomposite sol comprises a mixture of nanosize solid particles and preferably inorganic or organically modified, inorganic polycondensates or precursors thereof produced by the sol-gel process. In the coating composition, the binder composed of nanoparticles or nanocomposite is usually present as a sol or dispersion. In the hardened layer, it represents a matrix former. Due to this purely ceramic structure of the layer, a number of requirements are met. Apart from the high-temperature stability and the purity of the coating, adhesion of the layer to the substrate and mechanical stability are ensured as a result of the hardness and abrasion-resistance of the layer.

The nanosize solid particles are preferably metal oxide particles or systems which are converted into nanosize metal oxide particles after hardening by high-temperature treatment. In particular, the nanosize solid particles are selected from among $SiO_2$, $TiO_2$, $ZrO_2$, $Al_2O_3$, AlOOH, $Y_2O_3$, $CeO_2$, $SnO_2$, iron oxides and $Ta_2O_5$ or among precursors of these nanosize solid particles which are converted by means of the sol-gel process into these solid particles, with $SiO_2$ particles and/or precursors of $SiO_2$ particles which are converted by means of the sol-gel process into nanosize $SiO_2$ particles being particularly preferred.

The nanocomposites which are preferred according to the invention and their production by the sol-gel process are known in the prior art, in particular from DE 103 26 815 A1. Here, it is preferred that the nanosize solid particles are surface-modified with a surface-modifier having a molecular weight of less than 1500, in particular a surface modifier containing an anhydride group, acid amide group, amino group, SiOH group, hydrolysable radicals of silanes and/or a β-dicarbonyl group.

The nanocomposite is preferably obtainable by the sol-gel process by reacting nanosize solid particles with one or more silanes of the general formula:

$$R_x SiA_{(4-x)} \quad (I)$$

where the radicals A are identical or different and are hydroxyl groups or hydrolysable groups, the radicals R are identical or different and are nonhydrolysable groups and x is 0, 1, 2 or 3, with x being $\geq 1$ for at least 50% of the molar amount of the silanes. If only silanes of the formula (I) in which x=0 are used, purely inorganic nanocomposites are obtained; otherwise, the preferred organic-inorganic nanocomposites are obtained.

Suitable examples of silanes of the above formula (I) are likewise given in DE 103 26 815 A1.

In particular, the coatings of the invention are produced from alcoholic $SiO_2$-forming sols in which high-purity silicon nitride powders are dispersed. Since silicon nitride tends to undergo hydrolysis in the presence of water, water-based formulations should not be used; instead alcoholic $SiO_2$-forming sols are preferred. Furthermore, the use of high-purity starting chemicals (silicon nitride powder, silanes, alcohols, etc.) is preferred since very high-purity layers which, in particular, meet the requirements of the solar industry are obtained in this way.

In the shaped bodies of the invention, the substrate appropriately comprises quartz, graphite, ceramic (including silicon nitride ceramic), $SiO_2$ (fused silica) or an iron alloy. In a preferred embodiment, the shaped body is a melting crucible having a substrate composed of quartz, graphite or ceramic which is suitable for the processing of corrosive nonferrous metal melts, in particular silicon melts.

In another embodiment, the shaped body is a riser tube having a substrate composed of $SiO_2$ (fused silica) or an iron alloy for aluminium metallurgy.

The process for producing a shaped body according to the invention comprises at least the following steps:
  application of the slip of the invention to the substrate by single or repeated doctor blade coating, dipping, flooding, spin coating, spraying, brushing or painting,
  hardening of the applied slip to form a durable hard coating on the substrate.

To improve the adhesion, it can in some cases be advantageous to treat the substrate with diluted or undiluted binder sols or their precursors or other primers before contacting.

The solids content of the slips can be set by addition of solvent as a function of the chosen coating process. For spray coating, a solids content of from 2 to 70% by weight, preferably from 5 to 50% by weight and particularly preferably from 10 to 30% by weight, is usually set.

The final hardening can be preceded by one or more drying steps at room temperature or slightly elevated temperature, for example in a convection drying oven and/or by heating of the shaped bodies themselves. In the case of oxidation-sensitive substrates, drying and/or subsequent hardening can be carried out in a protective gas atmosphere, for example in $N_2$ or Ar or under reduced pressure.

The thermal hardening is carried out taking into account the heat sensitivity, preferably by heat treatment at temperatures above 50° C., preferably above 200° C. and particularly preferably above 300° C. The layers can also be baked at relatively high temperatures, preferably at temperatures of from 500 to 700° C., provided that the substrate is sufficiently stable at these temperatures.

In a further embodiment of the invention, the layers can be produced as multiple layers.

In a further embodiment of the invention, gradated layers in which the type and purity of the silicon nitride particles used can vary, for example from the bottom (substrate side) upwards (melt side), can be formed. Here silicon nitride grades which differ in respect of purity, particle size or particle morphology can be used within the layer structure. Furthermore, different binder contents can also be introduced into the gradated layers. These gradated layers can also be produced and arranged as multiple layers.

The shaped bodies of the invention having the durable hard coatings are suitable for use in the field of corrosive nonferrous metal melts such as melts of aluminium, glass, silicon and the like. Shaped bodies in the form of melting crucibles are suitable, in particular, for producing silicon melts, for accommodating liquid silicon and for crystallization of liquid silicon to form silicon blocks.

Shaped bodies in the form of riser tubes are suitable, in particular, for use in aluminium metallurgy, very particularly preferably in low-pressure aluminium casting.

The following examples illustrate the invention.

Comparative Example

Standard Suspension

This is a suspension of silicon nitride powder in distilled water without further additives produced as described in EP 963 464.

For further processing (brushing, rolling, spraying), only the rheology of this suspension is critical. The solids content is set accordingly, for example to 60-70% by weight for application by means of spray gun.

The suspension is applied to the cleaned, dust-free, dry crucible, if appropriate in a plurality of layers, so as to produce a homogeneous layer thickness of, for example, 500-800 μm. After drying, the coating is fired at about 1000-1100° C. before use as melt crucible.

The silicon nitride powder coating obtained should be bubble-free and crack-free and also have no other defects.

The silicon nitride layer produced in this way has only limited resistance to being touched and should be treated with corresponding care. Injury to the coating has to be avoided not only during charging with pieces of Si, but charging also has to be carried out so that slipping of pieces of Si is avoided during melting so that no defects in the powder layer are produced here either.

Example 1

Hard Silicon Nitride Coating

For an embodiment according to the invention of the silicon nitride suspension, a dispersion of 60% by weight of silicon nitride powder in ethanol (water-free) is produced. For this purpose, it is possible either to initially charge the powder and continuously incorporate the dispersion medium or to stir the powder into the initially charged amount of ethanol.

An equal amount of the binder (Ino® sil S-38, Inomat GmbH) is added to the ethanolic silicon nitride dispersion with stirring (converse order of addition also possible) to produce a sprayable suspension containing 30% by weight of silicon nitride.

The suspension is applied by spraying, with a plurality of layers being applied "wet to wet" to give layer thicknesses up to about 40 μm. After "airing" at room temperature, the coating is dried in a drying oven and subsequently fired at 500° C. for 30 minutes.

The coated crucible can now be used in the melting process. The defect-free Si ingot obtained can be demoulded without problems.

Example 2

Hard Silicon Nitride Coating

For a further embodiment according to the invention of the silicon nitride suspension, a dispersion of 60% by weight of silicon nitride powder in ethanol (water-free) is produced. For this purpose, it is possible either to initially charge the powder and continuously incorporate the dispersion medium or to stir the powder into the initially charged amount of ethanol.

The binder (Ino® sil S-38, Inomat GmbH) is added to the ethanolic silicon nitride dispersion in a ratio of silicon nitride: binder of 2:1 with stirring to produce a suspension containing 40% by weight of silicon nitride.

The higher-viscosity suspension is applied by dip coating, casting or brushing/rolling, with layer thicknesses up to about 100 μm being applied.

After "airing" at room temperature, the coating is dried in a drying oven and subsequently fired at 500° C. for 30 minutes.

The coated crucible can now be used in the melting process. The defect-free Si ingot can subsequently be demoulded without problems.

Example 3

Hard Silicon Nitride Coating

For a further embodiment according to the invention of the silicon nitride suspension for coating solar crucibles, a suspension containing 30% by weight of silicon nitride powder is produced directly in the liquid, ethanolic binder. For this purpose, the silicon nitride powder is incorporated continuously into the binder (Ino® sil S-38, Inomat GmbH) with stirring. To homogenize the mixture, it is treated on a roll mill for a number of hours.

The agglomerate-free 30% strength by weight silicon nitride suspension obtained in this way is applied by spraying, with a plurality of layers being applied "wet to wet" to give layer thicknesses of up to about 40 μm. After "airing" at room temperature, the coating is dried in a drying oven and subsequently fired at 500° C. for 30 minutes.

The coated crucible can now be used in the melting process. The defect-free Si ingot can be demoulded without problems.

Example 4

Hard Silicon Nitride Coating

For a further embodiment according to the invention of the silicon nitride suspension for coating solar crucibles, a suspension containing 60% by weight of silicon nitride powder is produced directly in the liquid, ethanolic binder. For this purpose, the silicon nitride powder is incorporated continuously into the binder (Ino® sil S-38, Inomat GmbH) with stirring. As an alternative, the binder can also be incorporated a little at a time into the initially charged silicon nitride powder. To homogenize the mixture, it is treated on a roll mill for a number of hours.

The agglomerate-free 60% strength by weight silicon nitride suspension obtained in this way is applied by brushing and rolling, with layer thicknesses up to about 100 μm being applied. After "airing" at room temperature, the coating is dried in a drying oven and subsequently fired at 500° C. for 30 minutes.

The coated crucible can now be used in the melting process. The defect-free Si ingot can be demoulded without problems.

The embodiments of the inventive silicon nitride coatings described in the examples differ from the reference coating according to the prior art in their lower layer thicknesses. Despite the lower layer thicknesses, functional, i.e. defect-free (bubble-free, crack-free), release layers are always produced. Due to the binder present, these layers have significantly higher adhesive strengths and scratch resistances than the standard silicon nitride powder coating. Despite the thinner coating, the layers are not damaged when charging or/and melting pieces of Si, so that contact between melt and crucible, which on solidification leads to adhesion and thus to spalling and cracks, is avoided.

The inventive silicon nitride coatings described are distinguished by the solids content, the silicon nitride:binder ratio and the layer thicknesses and accordingly the viscosity of the suspension, which determines the application technique used for the suspension, and the defect-free layers which can be achieved: the higher the silicon nitride:binder ratio, the thicker the layers; the lower the silicon nitride:binder ratio, the harder/more scratch resistant.

Depending on the respective melting/solar Si production process, the optimal coating system can thus be selected (matching to suspension production, to coating process and to the respective melting process).

The invention claimed is:

1. A slip for producing a durable hard coating on a substrate comprising:
   a) a suspension of silicon nitride particles in an amount of 30% by weight to 60% by weight and
   b) a binder comprising a nanocomposite comprising a mixture of nanosize solid particles and/or precursors of nanosize solid particles in an organically modified inorganic polycondensate or a precursor thereof from production via sol-gel process;
   wherein the slip does not comprise a release agent selected from the group consisting of graphite, graphite compounds, sulphides, selenides, tellurides, metal sulphides, metal selenides, metal tellurides, metal-free phthalocyanines, indanthrene dyes, borax, lead oxide, zinc oxide, mica, talc, cadmium chloride, lead iodide, cobalt chloride and silver sulfate.

2. The slip according to claim 1, wherein the organically modified inorganic polycondensate or precursor thereof is an organically modified inorganic polysiloxane or precursor thereof.

3. The slip according to claim 1, wherein the nanosize solid particles are metal oxide particles.

4. The slip according to claim 1, wherein the nanosize solid particles are selected from among $SiO_2$, $TiO_2$, $ZrO_2$, $Al_2O_3$, AlOOH, $Y_2O_3$, $CeO_2$, $SnO_2$, iron oxides, and $Ta_2O_5$, or among precursors of these nanosize solid particles which are converted by means of the sol-gel process into solid particles.

5. The slip according to claim 1, wherein $SiO_2$ particles and/or precursors of $SiO_2$ particles which are converted by means of the sol-gel process into nanosize $SiO_2$ particles are present as nanosize solid particles.

6. The slip according to claim 1, wherein the nanosize solid particles have been surface-modified with a surface modifier having a molecular weight of less than 1500.

7. The slip according to claim 1, wherein the nanosize solid particles have been modified with a surface modifier containing an anhydride group, acid amino group, amino group, SiOH group, hydrolysable radicals of silanes and/or a β-dicarbonyl group.

8. The slip according claim 1, wherein the nanocomposite is obtainable by the sol-gel process by reacting nanosize solid particles with one or more silanes of the general formula (I):

$$R_xSiA_{(4-x)} \quad (I)$$

where the radicals A are identical or different and are hydroxyl groups or hydrolysable groups, the radicals R are identical or different and are nonhydrolysable groups and x is 0, 1, 2, or 3, with at least 50 mol % of the silanes having $x \geq 1$.

9. The slip according to claim 1, wherein the binder is obtainable by the sol-gel process by reacting one or more silanes of the general formula (I):

$$R_xSiA_{(4-x)} \quad (I)$$

where the radicals A are identical or different and are hydroxyl groups or hydrolysable groups, the radicals R are identical or different and are nonhydrolysable groups and x is 0, 1, 2, or 3, with at least 50 mol % of the silanes having $x \geq 1$.

10. A shaped body comprising a substrate having a durable hard coating, wherein the hard coating has been produced from a slip according to claim 1.

11. A shaped body according to claim 10, wherein the substrate comprises quartz, graphite, ceramic, $SiO_2$ (fused silica) or an iron alloy.

12. A shaped body according to claim 10 which is a melting crucible having a substrate composed of quartz, graphite or ceramic for silicon melts.

13. A process for producing a shaped body according to claim 10, comprising the steps of:
   applying the slip to the substrate by using a single or repeat doctor blade coating, dipping, flooding, spin coating, spraying, brushing or painting,
   forming a durable hard coating on the substrate by hardening the applied slip.

* * * * *